United States Patent

Bakeman, Jr. et al.

[11] Patent Number: 5,480,748
[45] Date of Patent: Jan. 2, 1996

[54] PROTECTION OF ALUMINUM METALLIZATION AGAINST CHEMICAL ATTACK DURING PHOTORESIST DEVELOPMENT

[75] Inventors: Paul E. Bakeman, Jr., South Burlington; Hyun K. Lee, Essex Junction; Stephen E. Luce, Underhill, all of Vt.

[73] Assignee: International Business Machines Corporation, Armonk, N.Y.

[21] Appl. No.: 233,679

[22] Filed: Apr. 26, 1994

Related U.S. Application Data

[62] Division of Ser. No. 964,677, Oct. 21, 1992.

[51] Int. Cl.$^6$ .................................................. G03F 7/16
[52] U.S. Cl. .............................. 430/11; 430/14; 430/311; 148/DIG. 15; 437/229
[58] Field of Search ...................... 430/11, 14; 437/229, 437/194, 949; 148/DIG. 15, 16, 22, 116

[56] References Cited

U.S. PATENT DOCUMENTS

| | | | |
|---|---|---|---|
| 3,884,698 | 5/1975 | Kakihama et al. | 117/217 |
| 4,321,104 | 3/1982 | Hasegawa et al. | 156/643 |
| 4,474,642 | 10/1984 | Nakane et al. | 156/643 |
| 4,491,628 | 1/1985 | Ito et al. | 430/176 |
| 4,587,138 | 5/1986 | Yau et al. | 427/88 |
| 4,612,275 | 9/1986 | Gregor | 430/296 |
| 4,620,986 | 11/1986 | Yau et al. | 427/93 |
| 4,686,173 | 8/1987 | Kanamori et al. | 430/313 |
| 4,767,660 | 8/1988 | Hosoda et al. | 428/209 |
| 4,810,619 | 3/1989 | Pampalone et al. | 430/313 |
| 4,820,611 | 4/1989 | Arnold, III et al. | 430/271 |
| 4,910,122 | 3/1990 | Arnold et al. | 430/313 |
| 4,921,778 | 5/1990 | Thackeray et al. | 430/326 |
| 4,933,304 | 6/1990 | Chen et al. | 437/194 |
| 4,971,894 | 11/1990 | Memis et al. | 430/323 |
| 5,066,615 | 11/1991 | Brady et al. | 437/229 |
| 5,100,503 | 3/1992 | Allman et al. | 156/643 |
| 5,106,786 | 4/1992 | Brady et al. | 437/229 |
| 5,134,093 | 7/1992 | Onishi et al. | 437/197 |
| 5,207,868 | 5/1993 | Shinohara | 156/656 |
| 5,219,788 | 6/1993 | Abernathey et al. | 437/187 |
| 5,286,608 | 2/1994 | Koh | 430/313 |

OTHER PUBLICATIONS

Weston et al., "Microcorrosion of Al–Cu and Al–Cu and Al–Cu–Si alloys: Interaction of the metallization with subsequent aqueous photolothographic processing," J. Vac. Sci. Technol. A, vol. 8, No. 3, May/Jun. 1990, pp. 2025–2032.

V. Sadagropan, "Anti–Interference and Antireflection Coatings for Chromium Masks," IBM Technical Disclosure Bulletin, vol. 14, No. 3, Aug. 1971, p. 795.

*Primary Examiner*—Kathleen Duda
*Attorney, Agent, or Firm*—Heslin & Rothenberg

[57] ABSTRACT

A conductive layer in a semiconductor device is protected against chemical attack by a photoresist developer by forming a protective film overlying the conductive layer. The protective film is formed using a chemical reaction that occurs through defects in a passivation layer that was previously formed overlying the conductive layer. The chemical reaction substantially occurs at the surface of the conductive layer and chemically converts portions thereof in forming the protective film. Preferably, the conductive layer is aluminum or an alloy thereof containing copper and/or silicon, and the protective film is aluminum oxide formed on the aluminum layer to protect it from corrosion by tetramethyl ammonium hydroxide (TMAH). The passivation layer is TiN, and the chemical reaction used is oxidation of the aluminum layer through defects in the overlying TiN layer by placing in an ozone asher.

14 Claims, 1 Drawing Sheet

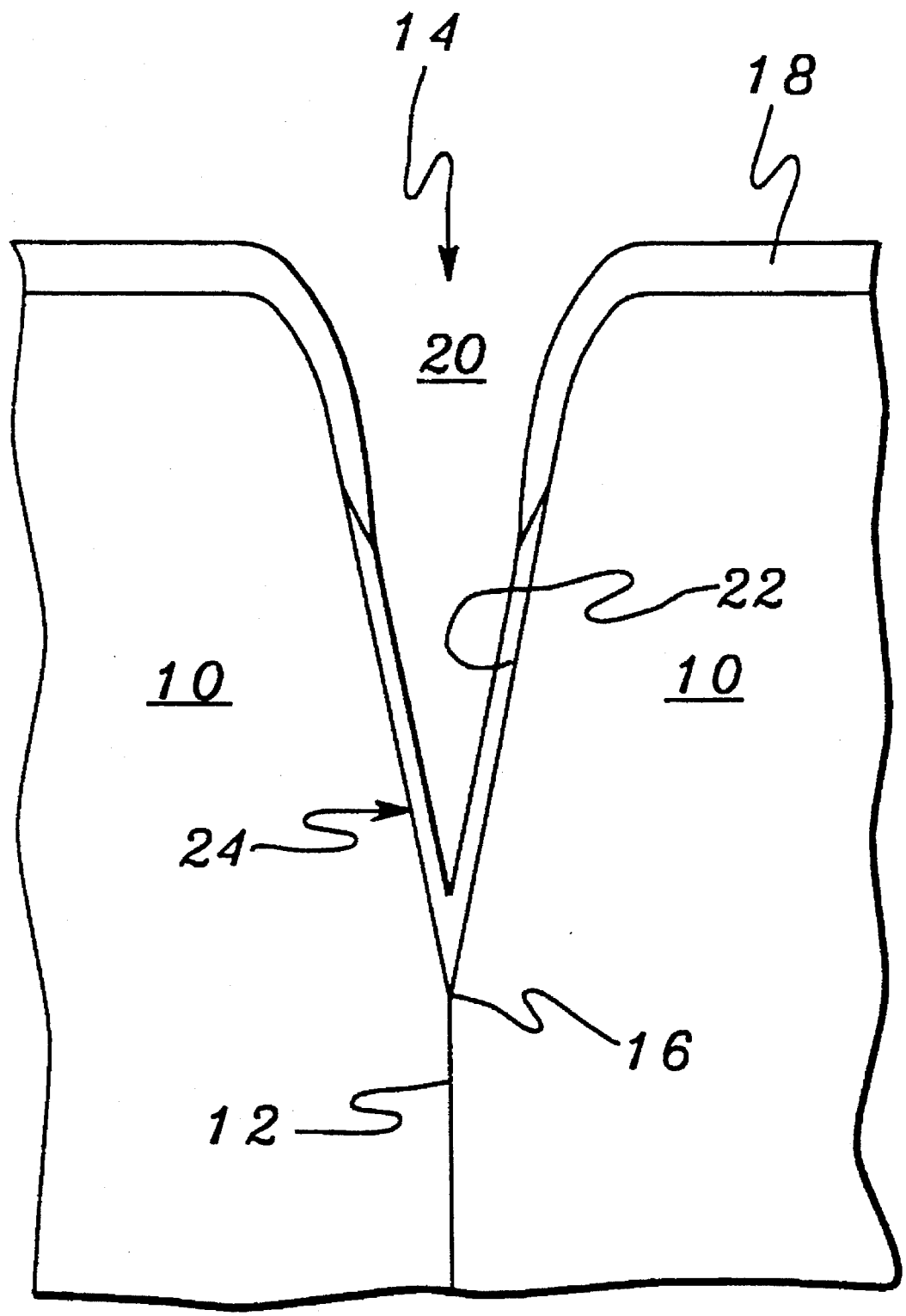

PROTECTION OF ALUMINUM METALLIZATION AGAINST CHEMICAL ATTACK DURING PHOTORESIST DEVELOPMENT

This application is a division, of application Ser. No. 07/964,677, filed Oct. 21, 1992 pending.

FIELD OF THE INVENTION

The present invention relates generally to microelectronic devices and, in particular, to the protection of a conductive layer, such as aluminum metallization (or interconnect), against chemical attack during photoresist development.

DESCRIPTION OF THE PRIOR ART

Photolithography is widely used to pattern metal interconnects in integrated circuits. Aluminum and aluminum alloys containing copper and/or silicon are commonly used to form this interconnect. As a part of the photolithography process, photoresist is applied over, say, an aluminum layer. Next, the photoresist is exposed to ultra-violet (UV) light and developed to form the desired interconnect pattern in the photoresist layer itself. The pattern formed in the photoresist is finally transferred to the underlying aluminum layer using, for example, reactive ion etching (RIE).

A photoresist developer often used during development of the photoresist is tetramethyl ammonium hydroxide (TMAH). Other developers such as sodium hydroxide, sodium metasilicate, or potassium hydroxide may also be used. However, one of the desirable properties of TMAH relative to other developers is that it is a metal-ion-free developer, which reduces metal ion diffusion and contamination in other parts of the integrated circuit.

An anti-reflective coating is typically formed over the aluminum layer prior to coating with photoresist. The anti-reflective coating is used to reduce deleterious effects resulting from undesired reflection of the UV light used to expose the photoresist layer. A common anti-reflective coating is TiN, which may be conveniently deposited overlying the aluminum layer by sputtering in the same machine used to apply the aluminum layer.

During development, say using TMAH, regions of the photoresist layer will be removed leaving a residual pattern in the photoresist corresponding to the desired interconnect pattern. Where these regions are removed, the underlying TiN and aluminum layers are exposed. RIE is used to remove these exposed regions, thus transferring the interconnect pattern to the TiN and aluminum layers.

Because the aluminum layer is polycrystalline and contains many grain boundaries, depressions (or holes) tend to form in the aluminum layer at these grain boundaries, particularly at grain boundary triple-points. These holes have diameters of about 200–300 Angstroms. Sputtered TiN is not able to completely cover all of these holes, thus leaving portions of the aluminum layer exposed. The regions in the TiN layer that fail to cover these holes are referred to as defects because it is desirable that the TiN layer completely cover the aluminum layer.

TiN is resistant to chemical attack by TMAH, but aluminum is not. Therefore, during photoresist development using TMAH, portions of the aluminum layer not covered by TiN can be corroded by TMAH. Also, because photoresist is not an adequate barrier to diffusion of TMAH, the aluminum layer can be corroded beneath the patterned photoresist as well as in regions where the photoresist has been developed away.

Corrosion of the aluminum layer by TMAH disrupts the integrity of the aluminum layer because it creates large craters having a center substantially near the former hole in the TiN layer that existed prior to corrosion. These craters are hemispherical in shape, have a diameter of about 0.5–2.0 microns, depending upon aluminum sputtering conditions and development time, and extend underneath the edge of the overlying TiN layer. Further, this corrosion leaves reaction products, believed to be aluminum hydroxide, that act as micromasks. These micromasks are resistant to the RIE used to pattern the TiN and aluminum layers. Often such a micromask will be formed where the overlying resist has been removed during development. In such a region, it is intended that the underlying, and now exposed, aluminum layer be removed during patterning (recall that TiN does not completely cover the aluminum layer in this region). However, the micromask prevents removal and proper patterning of the aluminum layer during the RIE.

In regions of the aluminum layer covered by micromasks, ring-shaped aluminum residuals will remain after the RIE. These residuals have a shape and size corresponding to that of the craters formed by corrosion. The ring-shape occurs because aluminum hydroxide contamination is a more effective mask on the sidewalls, rather than the bottom, of the craters formed in the aluminum layer.

After the RIE, if patterned interconnect lines happen to be centered about an aluminum residual of sufficient size, the residual will short the two interconnect lines, resulting in a defective integrated circuit. Even when formed in regions not resulting in such a short, these ring-shaped residuals are disadvantageous for several other reasons including a reduction in the structural integrity and current-carrying capacity of the interconnect lines.

The problem of undesired formation of micromasks resulting from corrosion of the aluminum layer by a photoresist developer has been avoided in other manufacturing processes by sputtering a Ti—W cap metal layer over the aluminum layer prior to photoresist development. Apparently, a Ti—W cap is able to fill the holes in the aluminum layer that frequently occur at grain boundary triple-points. However, the use of a Ti—W cap requires more processing steps because of the added Ti—W deposition step, and therefore, could result in a potentially higher defect density and lower yield due to particle contamination. Moreover, the Ti—W cap requires a more complex RIE process when patterning the aluminum layer. Specifically, a more complicated patterning process that includes an applied anti-reflection coating is required because Ti—W is not an anti-reflective coating.

Thus, there is a need for a structure that protects holes in the aluminum layer from attack by TMAH, that is conveniently applied over the aluminum layer prior to photoresist application, and that does not require substantial changes or additions to the processing required to manufacture an integrated circuit.

SUMMARY OF THE INVENTION

This need is satisfied, the limitations of the prior art overcome, and other benefits realized in accordance with the principles of the present invention by a protective film formed through defects in a passivation layer previously formed overlying a conductive layer in an integrated circuit. The protective film protects the conductive layer from chemical attack by a photoresist developer. The protective film is formed using a chemical reaction that occurs through the defects in the passivation layer. The chemical reaction substantially occurs at the surface of the conductive layer and chemically converts portions thereof in forming the protective film.

In the preferred embodiment of the invention, the conductive layer is aluminum or an alloy thereof containing copper and/or silicon, and the protective film is aluminum oxide formed on the aluminum layer to protect it from corrosion by TMAH. The passivation layer is TiN, and the chemical reaction used is oxidation of the aluminum layer through defects in the overlying TiN layer.

An important advantage of the present invention is that it prevents corrosion of a conductive layer in a semiconductor device without substantially altering the metallurgy stack or increasing the required processing of the device. Another advantage is that ring-shaped metal residuals are substantially eliminated in wafers having the structure according to the present invention. Thus, electrical shorts between narrowly-spaced metal interconnect lines are also substantially eliminated.

The foregoing and other objects, features, and advantages of the invention will be apparent from the following more particular description of a preferred embodiment of the invention, as illustrated in the accompanying drawing.

BRIEF DESCRIPTION OF THE DRAWING

The FIGURE is a cross-sectional view of a portion of a semiconductor device illustrating the formation of a protective film in accordance with the preferred embodiment of the invention.

BEST MODE FOR CARRYING OUT THE INVENTION

According to the present invention, a protective film is formed on a conductive layer to protect the conductive layer from chemical attack by a photoresist developer. The protective film is formed using a chemical reaction that occurs through defects in a passivation layer previously formed overlying the conductive layer. This chemical reaction occurs substantially at the surface of the conductive layer and chemically converts portions thereof in forming the protective film. At least one of the reactants for the chemical reaction is transported to the surface of the conductive layer by passing through defects in the passivation layer.

In the preferred embodiment of the invention, the conductive layer is aluminum or an alloy thereof containing copper and/or silicon, and the protective film is aluminum oxide formed on the aluminum layer to protect it from corrosion by TMAH. The passivation layer is TiN, and the chemical reaction used is oxidation of the aluminum layer through defects in the overlying TiN layer by placing the exposed aluminum layer in an oxidizing environment. The defects in the aluminum layer occur primarily near grain boundary triple-points.

Referring to the FIGURE, in the preferred embodiment of the invention, an aluminum layer (10) is formed, for example by sputtering, overlying a semiconductor wafer (not shown). Aluminum layer (10) can be formed over many types of underlying layers, as is well known in the art. For example, some of these underlying layers include Ti, Ti—W, and $SiO_2$.

Because aluminum layer (10) is polycrystalline, it contains many grain boundaries (12) throughout. Aluminum layer (10) also contains holes (14) that extend downward into the aluminum layer. These holes are most likely to appear in aluminum layer (10) at grain boundary triple-points (16), although holes may also appear at other grain boundaries in the aluminum layer. The scope of the present invention is intended to cover the protection of the aluminum layer at these other holes in addition to those located at grain boundary triple-points.

In the FIGURE, a TiN layer (18) is formed, for example by sputtering, on aluminum layer (10). TiN is used as an anti-reflective coating that reduces reflection during photoresist exposure to UV light. TiN is also a good diffusion barrier and is resistant to chemical attack by TMAH. TiN layer (18) substantially covers and protects aluminum layer (10) from chemical attack by TMAH during later photoresist developing steps. However, due to holes (14) in aluminum layer (10), TiN layer (18) has defects (20) at which it does not completely cover aluminum layer (10). Defects (20) occur because TiN layer (18) is sputtered and does not reach fully down into holes (14). At defects (20), the surface (22) of aluminum layer (10) is not fully covered by TiN layer (18), and therefore, will be exposed to TMAH during photoresist development unless protected.

According to the present invention, a protective film (24) is formed on surface (22). In the preferred embodiment, this protective film is aluminum oxide, which is resistant to chemical attack by TMAH. A process for forming protective film (24) will be discussed below. Together, TiN layer (18) and protective film (24) substantially cover all of aluminum layer (10) so that it is substantially not corroded during photoresist development.

The protective film of the present invention is formed by a chemical reaction in which one of the reactants is a portion of the conductive layer (i.e. a portion of the conductive layer is chemically converted) and at least one other reactant enters through defects in the overlying passivation layer. The chemical reaction is substantially localized to the regions about the defects so that desirable properties of other layers in the semiconductor device are not substantially altered or detrimentally affected. One purpose of the chemical reaction is to compensate for flaws or defects in the passivation layer. Thus, the protective film is formed through defects in the passivation layer, and the chemical reaction is substantially proximate to these defects.

In the preferred embodiment, in order to form a protective aluminum oxide on the exposed surface (22) of aluminum layer (10), the semiconductor wafer having the aluminum layer on the surface thereof is placed into an oxidizing atmosphere (or gas mixture) at a low temperature for a short period of time, say two minutes.

It is expected that many oxidizing atmospheres will form a protective aluminum oxide film. In the preferred embodiment, the wafer is placed into an ozone asher. It is believed that the atmosphere in the asher when used according to the present invention is a gas mixture of ozone and atomic oxygen. The asher used is a conventional photoresist stripper that has the capability of generating an ozone atmosphere. No unusual modifications or adjustments are made to the asher. It is used to form an aluminum oxide film under conditions substantially similar to those used for stripping photoresist from a wafer following RIE.

It is believed that other oxidizing atmospheres can be used according to the present invention. For example, it is believed that an atmosphere of ozone alone, diatomic oxygen, ionized oxygen, or a mixture of these gases along with any combination of the above-described oxidizing gases can be used to oxidize the aluminum layer. Also, in the preferred embodiment, nitrous oxide is added as a component of the oxidizing mixture. The reason that nitrous oxide is added is that it helps break down ozone to form atomic oxygen.

The oxidation of the aluminum layer is performed at a temperature below about 450° C. in order to avoid creeping or flowing of the aluminum layer. In the preferred embodiment, the oxidation temperature is about 300°–315° C. Temperatures substantially below 300° C. result in oxide films that are of reduced thickness and offer only marginal protection against TMAH chemical attack. Further, the oxidation is preferably performed for a time of less than two minutes. Oxidation for time periods between two to ten minutes can also be used. However, as the oxidation time increases, the rate of growth of the aluminum oxide film decreases due to self-passivation of the aluminum layer by the growing aluminum oxide film (i.e. oxidizing reactants must diffuse through an oxide film of increasing thickness to reach un-oxidized aluminum).

In general, the range of pressures during the formation of the protective film is about 1/1000 to 5 atm. Although the pressure used may be selected from a wide range, there would not be sufficient reactant at pressures below about 1/1000 atm, and pressures greater than 5 atm are not practical.

The combination of a low temperature oxidation for a short time period is a significant advantage of the present invention because undesired diffusion of contaminants in the integrated circuit is reduced. As a result, the reliability of the integrated circuit is expected to be higher.

In the preferred embodiment, the thickness of the protective aluminum oxide film is about 40 to 50 Angstroms, which is about twice the thickness of the natural oxide (i.e. about 20 to 25 Angstroms) on the aluminum layer. A natural oxide typically forms on the surface of the aluminum layer when it is exposed to oxygen at about room temperature during transfer to a subsequent processing step following sputtering of the aluminum and TiN layers.

For example, after wafers have had aluminum and TiN layers sputtered thereon, the sputtering machine is vented with nitrogen, and the wafers are cooled to a temperature of no greater than 100° C. before removal from the sputtering machine. When these wafers are removed, they contact an ambient atmosphere having oxygen, whereby a natural oxide forms. However, the thickness of this natural oxide alone is not sufficient to protect the aluminum layer from chemical attack during photoresist development using TMAH because aluminum oxide is not totally resistant to corrosion by TMAH. Instead, TMAH slowly removes aluminum oxide from the aluminum layer. A typical development time with TMAH is about two minutes. A natural oxide that has formed on the aluminum layer will typically be fully degraded after only about one minute of exposure to TMAH during photoresist development. Therefore, the aluminum layer will not be protected and instead will be corroded by TMAH.

In contrast, according to the present invention, a protective aluminum oxide film of about 40 to 50 Angstroms is formed by exposing the exposed surface of the aluminum layer to an oxidizing atmosphere at an elevated temperature greater than about 300° C. This temperature is substantially greater than the range of temperatures in which a natural oxide forms on the aluminum surface. According to the present invention, the protective oxide film will survive chemical attack by TMAH for a time period, for example, of about four minutes (this is about twice the typical development time for TMAH). As a result, the aluminum layer is protected from chemical attack by TMAH during the full photoresist development time. In general, according to the present invention, the protective aluminum oxide film is formed to be sufficiently thick to withstand chemical attack by the particular developer used.

Further, it is believed that the protective aluminum oxide film formed according to the present invention is of a density greater than that of a natural oxide because the protective oxide film is formed at a temperature substantially greater than that of the natural oxide. This is significant because a more dense oxide offers superior etch resistance.

Following the formation of a protective layer, photoresist is applied over the passivation layer (photoresist also will cover the protective layer). The photoresist is exposed and developed using, for example, TMAH to form a pattern therein. Next, the conductive layer is pattern using RIE. It should be appreciated that, in the preferred embodiment, neither the TiN layer nor the protective aluminum oxide layer substantially interferes with or complicates the RIE. Finally, the patterned photoresist layer overlying the patterned aluminum layer is removed in an ozone asher, as is well known.

It is believed that the protective film according to the present invention will protect the aluminum layer from many different types of developers which corrode aluminum including TMAH, sodium hydroxide, potassium hydroxide, and other strong bases. The scope of the present invention is intended to cover protection from these and other photoresist developers by a protective film.

The present invention is further illustrated in the example given below. This example is provided for the purpose of description, and the details provided therein are not intended to limit the scope of the present invention.

EXAMPLE

A 200 mm diameter silicon wafer, having a one micrometer layer of aluminum already formed thereon by deposition in a sputtering machine (model M2000 and manufactured by Varian Associates), was used as a starting material. Using the same sputtering machine, but set for reactive deposition and using a titanium source and nitrogen reactant, a 350 Angstrom TiN layer was sputtered onto the aluminum layer at 150° C. The wafer was then placed in an ozone asher (model 200AC and manufactured by Fusion Semiconductor Systems). The asher was operated at about 315° C., and a pressure of approximately 1 atm provided an oxidizing atmosphere of ozone, atomic oxygen, and nitrous oxide for about two minutes. A protective aluminum oxide was formed of about 4 nanometers thickness. Conventional photoresist processing and metal etching followed the preceding steps. Auger Electron Spectroscopy depth profiles of both oxidized and non-oxidized wafers indicated that the oxide layer formed according to the present invention was about twice the thickness of a natural aluminum oxide.

An important advantage of the present invention is that it prevents corrosion of a conductive layer in a semiconductor device without substantially altering the metallurgy stack or increasing the required processing of the device. Also, in the preferred embodiment, production throughput is not substantially reduced as it would be using a photoresist developer like sodium metasilicate, which does not corrode aluminum.

Another advantage is that ring-shaped metal residuals are substantially eliminated in wafers having the structure according to the present invention. Thus, electrical shorts between narrowly-spaced metal interconnect lines are also substantially eliminated.

Although the present invention has been described in detail above, it is not intended to be limited to the specific form set forth herein, but, on the contrary, it is intended to cover such alternatives and equivalents as can reasonably be included within the spirit and scope of the invention as defined by the appended claims.

For example, in other embodiments according to the present invention, the passivation layer can be silicon oxide, silicon nitride, tantalum nitride, or other refractory metal nitrides that are formed by sputtering or other methods that create defects therein due to a failure to completely cover an underlying conductive layer.

We claim:

1. A protective structure in a microelectronic device, comprising:

a passivation layer overlaying a conductive layer and having at least one defect through which the conductive layer is exposed to photoresist developer; and a protective film formed on said conductive layer within the boundary of the defect, using a chemical reaction wherein said film is of sufficient thickness to protect said conductive layer from chemical attack by the photoresist developer, a portion of said conductive layer comprising at least one of the reactants to said chemical reaction.

2. The structure of claim 1 wherein said conductive layer comprises a metal layer.

3. The structure of claim 2 wherein said film has a thickness substantially greater than about 20 to 25 Angstroms.

4. The structure of claim 1 wherein said passivation layer comprises a metal nitride, silicon oxide, or silicon nitride.

5. The structure of claim 1 wherein said passivation layer comprises titanium nitride.

6. The structure of claim 1 wherein said passivation layer comprises an anti-reflective coating.

7. The structure of claim 1 wherein said passivation layer comprises a diffusion barrier to at least one of said reactants to said chemical reaction.

8. The structure of claim 1 wherein said defect is located at a grain boundary triple-point.

9. The structure of claim 1 wherein said protective film comprises aluminum oxide.

10. The structure of claim 9, wherein the protective film has a thickness of about 40 to 50 Angstroms.

11. The structure of claim 1 wherein said chemical reaction is proximate to said defect.

12. The structure of claim 1 wherein said conductive layer comprises aluminum or an aluminum alloy.

13. The structure of claim 1 wherein said chemical reaction comprises oxidation in an oxidizing gas mixture comprising atomic oxygen, diatomic oxygen, ionized oxygen, ozone, or a combination thereof.

14. The structure of claim 1 wherein:

said conductive layer comprises aluminum; said passivation layer comprises titanium nitride;

said protective film comprises aluminum oxide; and said chemical reaction comprises oxidation at a temperature greater than about 300° C.

* * * * *